(12) United States Patent
Staszewski (10) Patent No.: US 6,252,733 B1
(45) Date of Patent: Jun. 26, 2001

(54) METHOD AND APPARATUS FOR ACQUIRING A PREAMBLE SIGNAL IN A HARD DISK DRIVE

(75) Inventor: Robert B. Staszewski, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/247,131

(22) Filed: Feb. 9, 1999

(51) Int. Cl.$^7$ ........................................................ G11B 5/09
(52) U.S. Cl. .................... 360/51; 331/17; 375/376
(58) Field of Search .................... 331/17, 18; 375/376, 375/371, 373, 375, 364, 366, 263, 354, 362; 360/51, 65, 46

(56) References Cited

U.S. PATENT DOCUMENTS 5,424,881 * 6/1995 Behrens et al. ...................... 360/40
5,696,639 * 12/1997 Spurbeck et al. ...................... 360/5

* cited by examiner

*Primary Examiner*—Alan T. Faber
(74) *Attorney, Agent, or Firm*—W. Daniel Swayze, Jr.; W. James Brady; Frederick J. Telecky, Jr.

(57) ABSTRACT

The hard disk drive includes a storage media system (12) and a read channel (27) for reading data from the storage media system (12). The read channel (28) is operable to read a preamble. Also included is a phase lock loop (53) which is coupled to the read channel (28) and operable to acquire the preamble signal. The phase lock loop (53) includes a timing gradient generator (70) which is operable to determine a timing gradient using a single term timing gradient equation. Also included is a loop filter (72), coupled to the timing gradient generator (70). The loop filter (72) determines an integral timing. A voltage controlled oscillator (74) is coupled to the loop filter (72) and determines a timing phase, the timing phase representing a timing adjustment for the read channel (28).

15 Claims, 4 Drawing Sheets

METHOD AND APPARATUS FOR ACQUIRING A PREAMBLE SIGNAL IN A HARD DISK DRIVE

TECHNICAL FIELD OF THE INVENTION

This invention relates generally to PRML devices and more particularly to a method and apparatus for acquiring a preamble signal in an EPR4 hard disk drive.

BACKGROUND OF THE INVENTION

As computer hardware and software technology continues to progress, the need for larger and faster mass storage devices for storing computer software and data continues to increase. Electronic databases and computer applications such as multimedia applications require large amounts of disk storage space. An axiom in the computer industry is that there is no such thing as enough memory and disk storage space.

To meet these ever increasing demands, hard disk drives continue to evolve and advance. Some of the early disk drives had a maximum storage capacity of five megabytes and used fourteen inch platters, whereas today's hard disk drives are commonly over one gigabyte and use 3.5 inch platters. Correspondingly, advances in the amount of data stored per unit of area, or areal density, have dramatically accelerated. For example, in the 1980's, areal density increased about thirty percent per year while in the 1990's annual areal density increases have been around sixty percent. The cost per megabyte of a hard disk drive is inversely related to its areal density.

Mass storage device manufacturers strive to produce high speed hard disk drives with large data capacities at lower and lower costs. A high speed hard disk drive is one that can store and retrieve data at a fast rate. One aspect of increasing disk drive speed and capacity is to improve or increase the areal density as well as increases rotational speed. Areal density may be increased by improving the method of storing and retrieving data.

In general, mass storage devices and systems, such as hard disk drives, include a magnetic storage media, such as rotating disks or platters, a spindle motor, read/write heads, an actuator, a pre-amplifier, a read path, a write path (as traditionally part of the read channel), a servo controller or digital signal processor, and control circuitry to control the operation of the hard disk drive and to properly interface the hard disk drive to a host or system bus. The read path, write path, servo controller, and a memory might be implemented as one integrated circuit that is referred to as a data channel. The control circuitry often includes a microprocessor or digital signal processor (DSP) for executing control programs or instructions during the operation of the hard disk drive.

A hard disk drive performs write and read operations when storing and retrieving data. A typical hard disk drive performs a write operation by transferring data from a host interface to its control circuitry. The control circuitry then stores the data in a local dynamic random access memory. A control circuitry processor schedules a series of events to allow the information to be transferred to the disk platters through a write channel. The control circuitry moves the read/write heads to the appropriate track and locates the appropriate sector of the track. Finally, the hard disk drive control circuitry transfers the data from the dynamic random access memory to the located sector of the disk platter through the write channel. A sector generally has a fixed data storage allocation, typically 512 bytes of user data. A preamble is provided before each sector and allows for the read/write head to adjust to the proper sampling scheme before reading the user data. A write clock controls the timing of a write operation in the write channel. The write channel may encode the data so that the data can be more reliably retrieved later.

In a read operation, the appropriate sector to be read is located by properly positioning the read head and data that has been previously written to the disk is read. The read/write head senses the changes in the magnetic flux of the disk platter and generates a corresponding analog read signal. The read channel receives the analog read signal, conditions the signal, and detects "zeros" and "ones" sequences from the signal. The read channel conditions the signal by amplifying the signal to an appropriate level using automatic gain control (AGC) techniques. The read channel then filters the signal, to eliminate unwanted high frequency noise, equalizes the samples to fit the particular spectrum, detects "zeros" and "ones" sequences from the signal, and formats the binary data for the control circuitry. The binary or digital data is then transferred from the read channel and is stored in the DRAM of the control circuitry. The processor then communicates to the host that data is ready to be transferred. A read clock controls the timing of a read operation in the read channel.

As the disk platters are moving, the read/write heads must align or stay on a particular track. This is accomplished by reading auxiliary information from the disk called a servo wedge. The servo wedge indicates the position of the heads both in a radial direction and along the circumference of a track. The data channel receives this position information so the servo controller can continue to properly position the heads on the track.

In modern disk drives the PRML scheme is the most popular detection scheme. PRML is an acronym for Partial Response Maximum Likelihood. PRML detection consist of a maximum likelihood detector of a partial response coding method.

A first generation of PRML channels was equalized using a PR4 response. PR4 stands for Class IV partial response and is a way to model the pulse shape of the sampled signal. However, at current recording channel densities, frequency response of the magnetic recording channel closely resembles an extended partial response class 4 (EPR4) channel response. The discrete-time impulse response transfer function of an EPR4 channel is $1+D-D^2-D^3$, where "D" $=e^{-j\omega T}$, where "$\omega$" is a frequency variable in radians per second and "T" is the sampling time interval in seconds. An EPR4 channel has more low frequency and less high frequency content than a PR4 channel. Therefore, modeling a magnetic recording channel as an EPR4 response yields better performance at higher recording channel densities, since equalizing a magnetic recording channel to an EPR4 channel response results in less high frequency is noise enhancement.

An analog signal is provided to a read channel as described above. The read channel samples the preamble once per clock cycle. One of the purposes of acquiring the preamble signal is to synchronize the times at which samples are acquired from the analog signal. Data is stored in the analog signal according to an EPR4 controlled intersymbol interference scheme. It has been determined that sampling of these data values is optimum at particular times. Therefore, it is desirable to align sampling of the analog signal with the clock signal of the read channel so that sampling occurs at correct time periods. This alignment is often performed iteratively by components similar in operation to a phase lock loop.

In some implementations, the phase difference between the sampled analog signal and the clock signal that would provide optimum sampling is adjusted by estimating the difference between the phases of the sampled analog signal and the clock signal according to predetermined formulas based upon PR4 response. However, it has been determined that these equations do not lead to desirable correction of the phase differences of an EPR4 response system and have a stable false-locking operating point.

SUMMARY OF THE INVENTION

Accordingly, a need has arisen for an improved method and system for acquiring a preamble signal in an EPR4 hard disk drive. The present invention provides an apparatus and method for acquiring a preamble signal in a hard disk drive that addresses shortcomings of prior systems and methods.

According to one embodiment of the invention, a method for acquiring a preamble signal in a hard disk drive using an EPR4 scheme is provided. In the first step an initial sample value of the preamble is read in using a clock value. In the next step a timing gradient value is calculated using a single term timing gradient equation. Then, a new timing phase is calculated using the timing gradient value, the timing phase representing a timing adjustment.

According to another embodiment of the invention, a hard disk drive system is provided. The hard disk drive comprises a storage media system and a read channel for reading is data from the storage media system. The read channel operable to read a preamble. Also included is a phase lock loop which is coupled to the read channel and operable to acquire the preamble signal. The phase lock loop includes a timing gradient generator which is operable to determine a timing gradient using a single term timing gradient equation. Also included is a loop filter, coupled to the timing gradient. The loop filter determines a sum of proportional and integral timing. A voltage controlled oscillator is coupled to the loop filter and determines a timing phase, the timing phase representing a timing adjustment for the read channel.

Embodiments of the invention provide numerous technical advantages. For example, in one embodiment of the invention, a preamble for an EPR4 scheme can be acquired efficiently by utilizing an improved one term timing gradient equation.

Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following descriptions taken in connection with the accompanying drawings in which.

DETAILED DESCRIPTION OF THE INVENTION

Embodiments of the present invention and its advantages are best understood by referring to FIGS. 1A through 7 of the drawings, like numerals being used for like and corresponding parts of the various drawings.

Figure 1A:
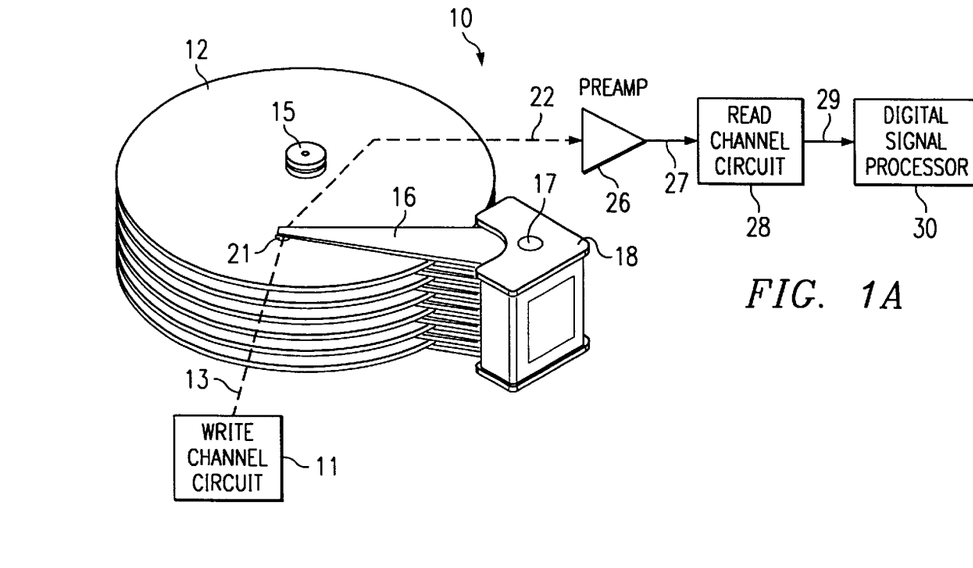
FIG. 1A is a diagrammatic view of a portion of a hard disk drive system according to the teachings of the present invention.

FIG. 1A is a diagrammatic view of a portion of a hard disk drive system according to the teachings of the present invention. Hard disk drive system 10 includes a plurality of magnetic disks 12. Magnetic disks 12 are fixedly secured to a spindle 15. Spindle 15 is rotationally driven by a spindle motor (not explicitly shown). a plurality of arms 16 are supported for pivotal movement about an axis defined by a pivot axis 17. Pivotal movement of arms 16 is controlled by a voice coil motor 18. At an outer end of each arm 16 is a read/write head 21. Head 21 includes respective portions that serve as a read head and a write head for reading from, and writing to, magnetic disks 12, respectively. These two heads can be combined in certain embodiments.

As illustrated, write path circuit 11 provides a magnetic disk input signal 13 to magnetic disks 12. Magnetic disk input signal 13 comprises a series of binary zeros and ones. a magnetic disk output signal 22, based on the magnetic disk input signal 13, is provided from magnetic disks 12 to a preamplifier 26 by head 21. An output signal 27 of preamplifier 26 is provided to a read channel circuit 28. An output signal 29 of read channel circuit 28 is provided to a digital signal processor 30. According to one embodiment of the invention, read channel circuit 28 is a partial response maximum likelihood (PRML) circuit.

Figure 1B:
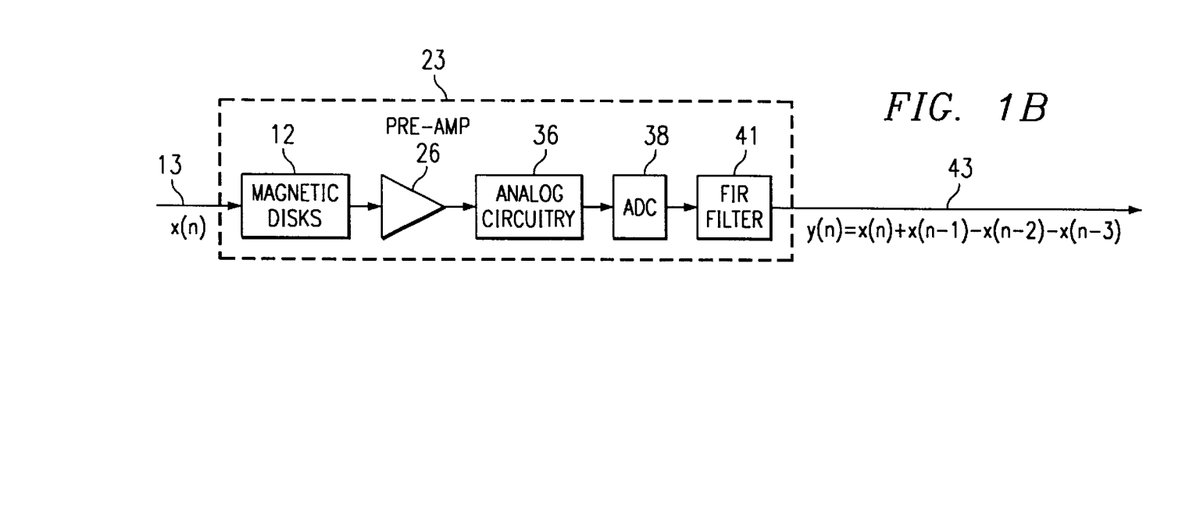
FIG. 1B is a block diagram illustrating input and output equations of magnetic disks in the hard disk drive system shown in FIG. 1A.

FIG. 1B is a block diagram illustrating input and output characteristics of a portion 23 of hard disk drive system 10. Portion 23 of hard disk drive system 10 includes magnetic disks 12, preamp 26, and portions of read channel circuit 28 including, analog circuitry 36, an analog-to-digital converter 38, and a finite impulse response filter 41. These elements of portion 23 are described in greater detail below in conjunction with FIG. 2. As illustrated, according to one embodiment of the invention, the density at which data in magnetic disk input signal 13 is written to magnetic disks 12 produces a digital output signal 43 from a finite impulse response filter 41 that is shaped and related to magnetic disk input signal 13 by the formula:

$$y(n)=x(n-1)(n-11)-x(n-2)-x(n-3),$$

where x(n)=magnetic disk input signal 13 at time n; and
y(n)=magnetic disk output signal 22 corresponding to x(n).

This described ideal relationship, which approximates the relationship between digital output signal 43 and magnetic disk input signal 13, is known as an EPR4 frequency response. It does not include additive noise term or amplitude scaling. In conjunction with other elements of read channel circuit 28, a Viterbi detector in read channel 28 determines the value of magnetic disk input signal 13 based on the received sequence of digital output signal 43.

Figure 2:
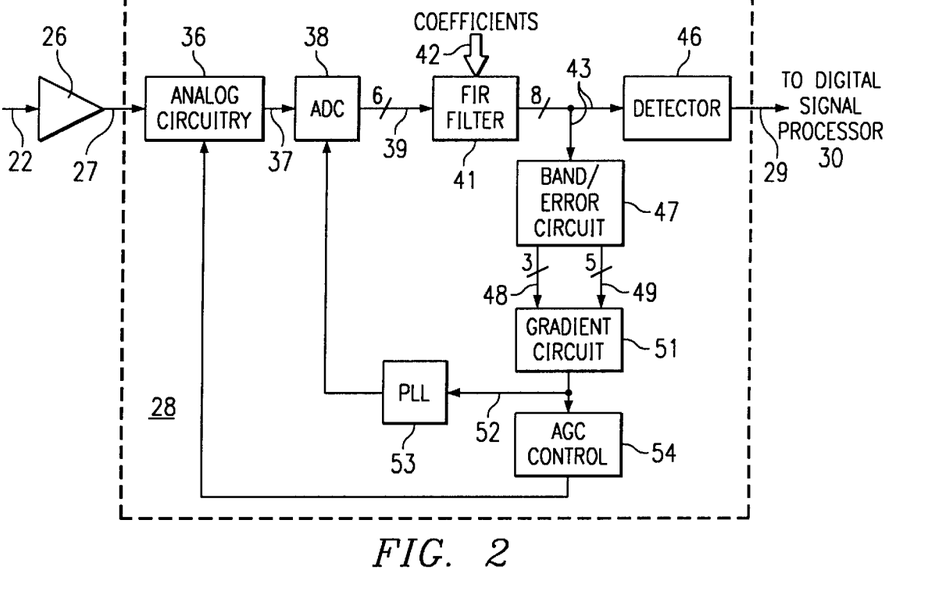
FIG. 2 is a block diagram of a read channel circuit in the hard disk drive system illustrated in FIG. 1A.

FIG. 2 is a block diagram of an exemplary read channel circuit 28 of hard disk drive system 10 illustrated in FIG. 1. Read channel circuit 28 includes analog circuitry 36. Analog circuitry 36 receives output signal 27 from preamp 26. Analog circuitry 36 may include an automatic gain control circuitry (not explicitly shown) and a continuous time filter (not explicitly shown), such as a low pass filter to boost and shape frequency spectrums and to remove unwanted higher frequency noise from output signal 27. An analog circuitry output signal 37 is provided by analog circuitry 36 to an analog-to-digital converter circuit 38. Analog-to-digital converter 38 receives analog circuitry output signal 37, samples it, and produces a 6-bit digital output signal 39.

Digital output signal 39 of analog-to-digital converter 38 is provided to a sampled equalizer, which may be, for example, a finite impulse response filter 41. Finite impulse response filter 41 receives one or more coefficients 42. Coefficients 42 define operational characteristics of filter 41. Filter 41 produces an 8-bit digital output signal 43, which is equalized to the desired EPR4 response. A detector 46 receives digital output signal 43 of filter 41. Detector 46 produces detector output signal 29, which as described above is an estimation of magnetic disk input signal 13. Detector output signal 30 is converted from a serial format to a parallel format and provided to digital signal processor 29, as described in conjunction with FIG. 1A above. All decoding, descrambling or uncoding (postcoding) circuitry may optionally be provided in read channel circuit 28 between detector 46 and digital signal processor 30.

Digital output signal 43 of filter 41 is also supplied to a band/error circuit 47. Band/error circuit 47 extracts band and error information from digital output signal 43.

Band/error circuit 47 produces a 3-bit digital signal 48 representing a band value. Band/error circuit 47 also produces a 5-bit digital signal 49 representing an error value. Band and error values 48 and 49 are supplied to a gradient circuit 51. An output signal 52 of gradient circuit 51 is supplied to a phase locked loop 53. Phase locked loop 53 has as an output a clock signal that is coupled to an input of analog-to-digital converter 38. Phase locked loop 53 facilitates timing recovery by ensuring that analog-to-digital converter 38 samples analog circuitry output signal 37 at points in time that optimize the operation of read channel circuit 28. According to the teachings of the present invention, an improved timing gradient equation, to be utilized in the timing gradient generator of phase lock loop 53, will allow for rapid and accurate acquisition of the EPR4 preamble signal. This is further discussed in conjunction with FIGS. 3 through 7.

Output signal 52 of gradient circuit 51 is also coupled to an automatic gain control circuit 54. The output of automatic gain control circuit 54 is provided to analog circuitry 36. Automatic gain control circuit 54 facilitates gain recovery, in particular by controlling an automatic gain control circuit located within analog circuitry 36 (not explicitly shown), so as to optimize the operation of read channel circuit 28.

Detector 46 receives 8-bit digital output signal 43 and produces detector output signal 29, which represents a value written to magnetic disks 12, such as a value within magnetic disk input signal 13.

Figure 3:
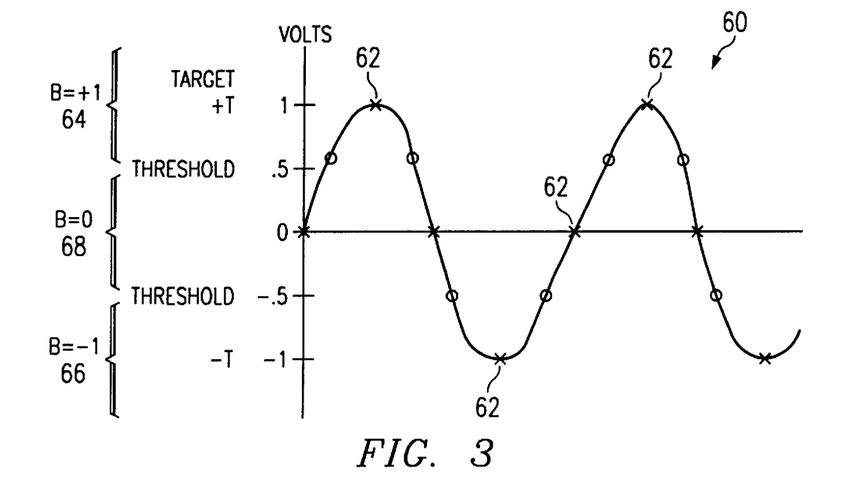
FIG. 3 illustrates an exemplary preamble signal in a hard disk drive sector.

FIG. 3 illustrates an exemplary preamble signal for a hard disk drive sector. Typically, for both PR4 and EPR4 implementations, the preamble resembles a sinusoidal function. For each type of preamble, i.e., a PR4 preamble and an EPR4 preamble, there exists what is known as ideal sampling points. When the analog circuitry output signal 27 is sampled at the ideal sampling point, the data contained in the sector will be correctly read.

Shown in FIG. 3 is an exemplary preamble signal 60 with ideal sampling instances for an EPR4 scheme 62. These points occur at 0, 1 and −1 on the sinusoidal function. For PR4 schemes, the ideal sampling values occur at $\pm\sqrt{2}/2$. Also shown in FIG. 3 are the three band values for an EPR4 scheme. For an EPR4 scheme, if a sample value is greater than 0.5, it lies in band one 64 with a +1 value; if the value is below −0.5, then it lies in band two 66 and has a value of −1; and if the sample value lies between 0.5 and −0.5 then it lies in band three 68 and has a value of 0. Band values are detected by band/error circuit 47 as seen in FIG. 2. The value 0.5 in an EPR4 scheme is known as the threshold value and is typically measured in terms of volts, or integer values for a quantized digital signal.

Figure 4:
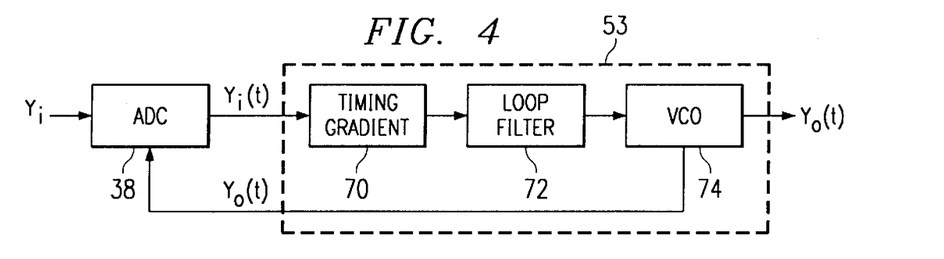
FIG. 4 is a block diagram of the phase lock loop in accordance with the teaching of the present invention.

FIG. 4 is a block diagram of the phase lock loop in accordance with the teaching of the present invention. Phase lock loop 53 is illustrated in FIG. 2. In an exemplary embodiment, phase lock loop 53 comprises a timing gradient generator 70, a loop filter 72 and a voltage controlled oscillator (VCO) 74 attached to an ADC sampler 38. In a traditional phase lock loop, a phase detector detects the phase difference from an input signal and a feedback signal and produces a signal which would cause the VCO to change its output to align with the input signal.

In the present invention, phase lock loop 53 operates differently. Instead of detecting a phase difference, timing gradient generator 70 is operable to take the incoming sampled signal and calculate a timing gradient using a specific timing gradient equation. The timing gradient value is then used to calculate a proportional and integral timing. The proportional and integral timing and the timing gradient is then used to calculate a timing phase which is then used to calculate the time at which the next sampling point is taken by ADC 38. Thus the timing phase serves to adjust the subsequent sampling of the preamble. As phase lock loop 53 operates, the sampling point moves closer to the ideal sampling instance. For PR4 schemes the timing gradient equation is well known and is of the form:

$$tg_i = b_i y_{i-1} - b_{i-1} y_i \qquad (1)$$

Where:

$y_i$ is the sample value,
$b_i$ is the band value,
$y_{i-1}$ is the previous sample value, and
$b_{i-1}$ is the previous band value.

The band values in a PR4 scheme are either 1 or −1 depending on if the sampled value is positive or negative. The equation is known as the Mueler and Muller equation. When formulating timing gradient equations, it is desirable that the equation is near zero in the area closest to the ideal sampling instances, but allows for rapid correction (change) when the sample value is far from the ideal sampling instances.

Figure 5A:
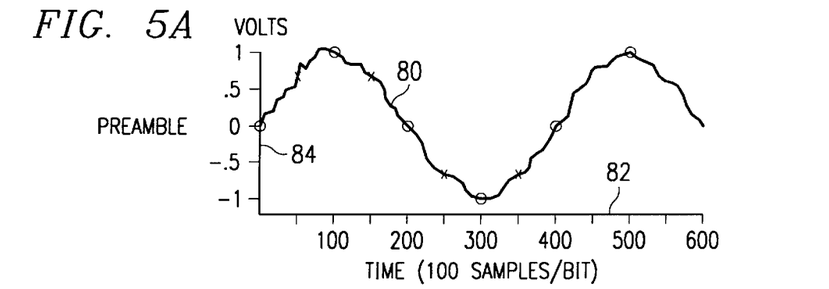
FIG. 5A illustrates an exemplary noisy preamble signal.

Turning to FIG. 5A, FIG. 5A illustrates an exemplary preamble signal 80 in a noisy environment. The x-axis 82 is measured in terms of 100 samples per symbol bit. The y-axis 84 is measured in terms of volts. As mentioned previously, the ideal sampling instances for an EPR4 scheme is at 0, 1 and −1 corresponding to x-axis 82 values of 0, 100, 200, 300, . . . 100n. For a PR4 scheme the ideal sampling instances are at $\pm\sqrt{2}/2$ corresponding to x-axis 82 values of 50, 150, 250, . . . 100n+50.

Figure 5B:
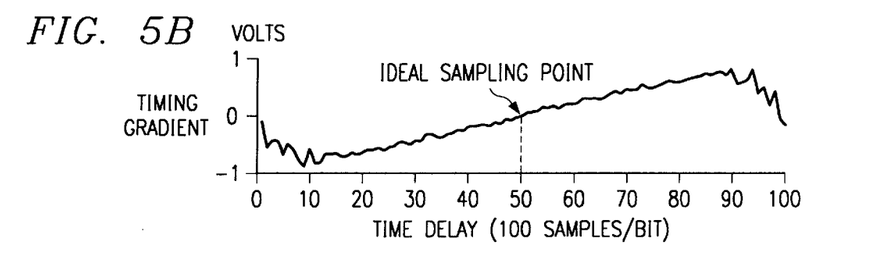
FIG. 5B illustrates a graph of the timing gradient equation for PR4 schemes.

FIG. 5B illustrates the graph of the averaged timing gradient equation for a PR4 scheme (equation (1)). The first ideal sampling instance for a PR4 scheme occurs at a time delay of 50. At this point the timing gradient is zero, which is what is expected. At the far end of the graph, between 0 and 10 and 90 and 100, the graph of the equation shows a decreasing function. These are metastable regions. If a sampling point is taken in this region, subsequent corrected sampling points might stay in this region. This is not a problem for a PR4 scheme since the overall function is an increasing function from 10 to 90 and most sampling points would be in that time delay region. However, for an EPR4 scheme, the ideal sampling instances occur at 0 and 100 time delay. Thus, sampling points will occur in the metastable regions and lead to poor adjustments.

Figure 5C:
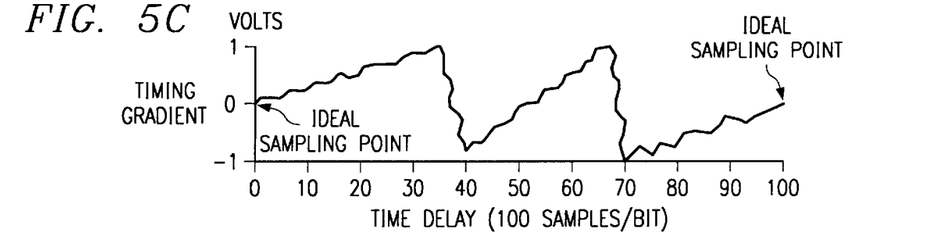
FIG. 5C illustrates a graph of the timing gradient for an EPR4 scheme using PR4 equations; and, FIG. 5D illustrates a graph of the EPR4 timing gradient equation for EPR4 schemes.

FIG. 5C illustrates a graph of the average timing gradient for a EPR4 scheme using the PR4 timing gradient equations. Three distinct increasing regions can be seen in the graph. If a sample point is chosen in the middle region, subsequent corrected sampling points could never leave the region even though the system may seem to be stable. This region is known as a false stable region. The existence of this false, stable region illustrates the fact that PR4 timing gradient equations should not be used in an EPR4 scheme.

Due to the existence of false, stable regions, modified timing gradient equations are needed for EPR4 schemes. In one embodiment of the present invention the following equation for the timing gradient, $tg_i$, is used:

$$tg_i = -b_{i-1} y_i \text{ if } |y_i| < |y_{i-1}|$$
$$tg_i = b_i y_{i-1} \text{ otherwise} \quad (2)$$

where y is defined as before with respect to Equation (1) and b is the band value, b=1 if $y \geq 0.5$, b=0 if $-0.5 < y < 0.5$ and b=−1 if $y < -0.5$. Note that for the EPR4 scheme, the timing gradient equation is a single term equation that requires both the previous and current sample points as opposed to the two term equation for the PR4 scheme In certain cases, the above equation can be simplified by using the following equation:

$$tg_i = -s_{i-1} y_i \text{ if } |y_{i-1}| < |y_{i-1}|$$
$$tg_i = s_i y_{i-1} \text{ otherwise} \quad (3)$$

s is the sign bit and y is as before. S=1 if $y \geq 0$ and S=−1 otherwise and y is the current sample value and $y_{i-1}$ is the previous sample value.

This implementation is simpler than that shown in Equation (2) in that the coefficient, s, is either a 1 or −1, and depends on the sign of the sample value. In digital implementations, a single bit value of 0 or 1 is used to represent 1 or −1 for sign bit. Essentially, this equation, Equation (3), is the same as the original equation, Equation (2), if we restrict the original equation from having a band equal to zero. This restriction is reasonable because it is impossible under normal circumstances that a band value of 0 will be used because it will be impossible for band value 0 to occur in two conjunctive sample points.

Therefore, for the modified timing gradient equation, Equation (3) , if the current sampling point is closer to zero than the previous sample point the first equation is used. Otherwise, the second equation is used. Notice that the timing gradient for an EPR4 scheme has only a single term.

Figure 5D:
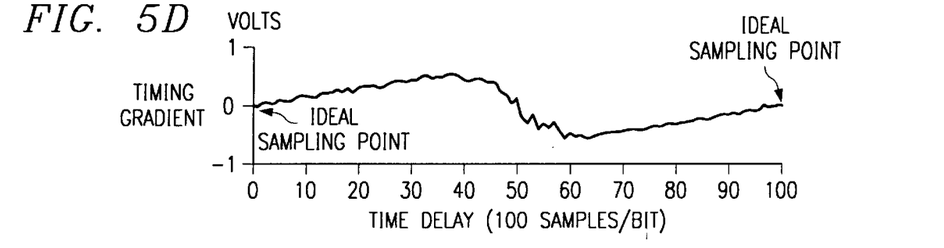

Turning to FIG. 5D, Equation (2), the first modified timing gradient equation, is graphed in FIG. 5D. Near the ideal time delay values of 0 and 100 the timing gradient goes to zero. When the sample is farthest from the ideal sampling points, the timing gradient is large, indicating a large timing gradient correction. This graph illustrates the effectiveness of the new timing gradient equation. The graph of the alternative timing gradient equation, Equation (3)) is essentially identical.

Thus, the incoming sample voltage and feedback voltage or its quantized value is used to calculate the timing gradient. The timing gradient value is used in loop filter 72 and VCO 74, as illustrated in FIG. 3, to calculate the sampling adjustment. Loop filter 72 and VCO 74 behavior can be modeled by the following equation:

$$dT_i = dT_{i-1} - \rho tg_i \tau_i = \alpha tg_i - dT_{i-1} \quad (4)$$

Where is the proportional loop gain and $\rho$ is the integral term loop gain which can be determined based on loop filter characteristics. $\tau_i$ is known as the timing phase and $dT_i$ the integral timing. $\tau_i$ is used to calculate the next sampling instance. This is similar to the phase adjustment calculated in a typical phase lock loop except that the calculation on the present invention is based on timing instance adjustments. The calculation of the timing phase, $\tau_i$, and integral timing, dT , according to the above Equation (4) that utilizes the improved single term gradient equations of Equation (2) and Equation (3) efficiently finds the correct timing phase that corresponds to an ideal sampling instance for a EPR4 scheme.

Figure 6A:
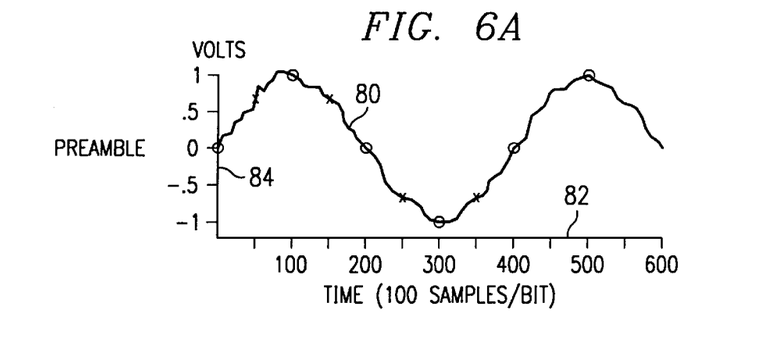
FIG. 6A illustrates an exemplary noisy preamble signal.

FIG. 6A illustrates an exemplary preamble signal 80 in a noisy environment. FIG. 6A, in fact, is the same as FIG. 5A. As before, the x-axis 82 is measured in terms of 100 samples per symbol bit. The y-axis 84 is measured in terms of volts. As mentioned previously, the ideal sampling instances for an EPR4 scheme is at 0, 1 and −1 corresponding to x-axis 82 values of 0, 100, 200, 300, . . . 100n. For a PR4 scheme the ideal sampling instances are at $\pm\sqrt{2}/2$ corresponding to x-axis 82 values of 50, 150, 250, . . . 100n+50. FIG. 6A is illustrated to help explain the following FIG. 6B, 6C, and 6D. These FIGURES illustrate the gain gradient, a factor used to calculate the gain in automatic gain control 54.

Figure 6B:
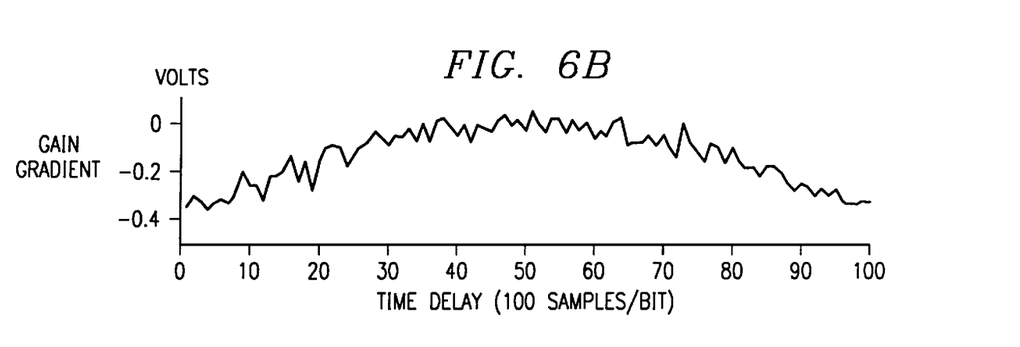
FIG. 6B illustrates a graph of the gain gradient equation for PR4 schemes.

FIG. 6B illustrates the gain gradient for a PR4 scheme. The PR4 gain gradient equation is:

$$gg_i = b_i e_i + b_{i-1} e_{i-1} \quad (5)$$

Where the gain gradient is $gg_i$, b is the band information (1, 0, −1 for PR4 schemes) and e is an error value defined as the sample value minus a target value. As noted earlier, the ideal sampling point for a PR4 scheme is at a time delay of 50, where the gain gradient is near 0, indicating little or no correction is needed. Far away from the ideal sampling point for a PR4 scheme, the gain gradient takes on a large (in the absolute value sense) value, indicating a large correction factor gain calculation when the gain gradient is far from the ideal sampling point.

Figure 6C:
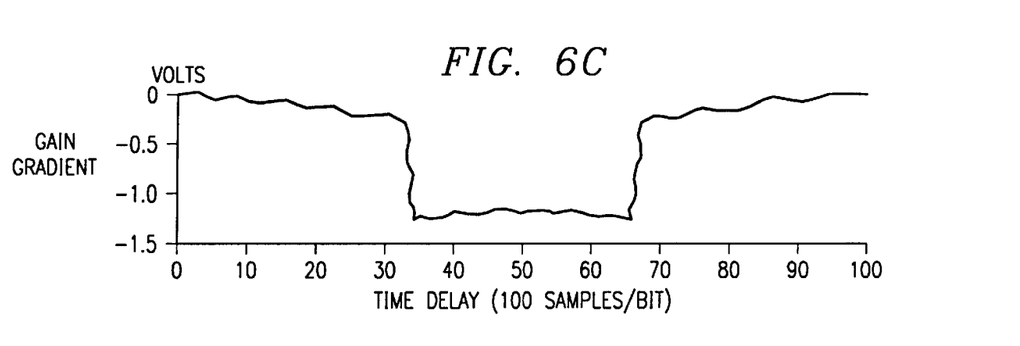
FIG. 6C illustrates a graph of the gain gradient for an EPR4 scheme using PR4 equations; and, FIG. 6D illustrates a graph of the EPR4 gain gradient equation for EPR4 schemes.

FIG. 6C illustrates the gain gradient for a EPR4 scheme using the conventional PR4 equations. Near the ideal sampling points of a time delay equal to 0 and 100, the gain gradient is near 0 as expected. However, a sample taken near time delay equal to 50 will cause the corrected sample values to stay in the middle region. This is an example of a false, stable region for gain gradient calculations and illustrates the need for different gain gradient equations for EPR4 schemes.

Figure 6D:
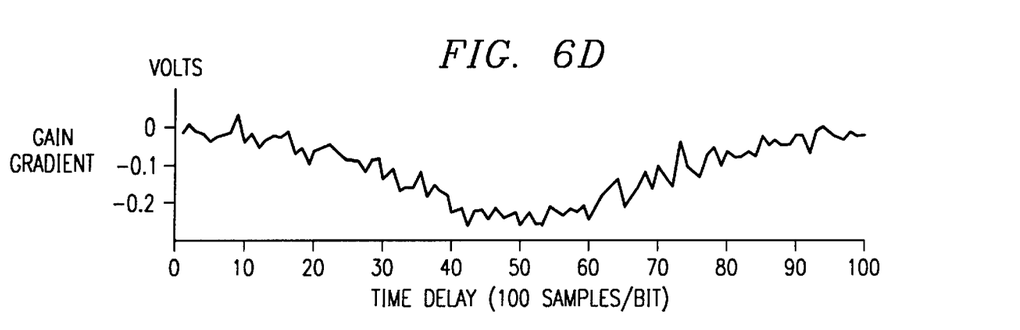

FIG. 6D illustrated the gain gradient for an EPR4 scheme using EPR4 gain gradient equations. The gain gradient equations are:

$$gg_i = s_{i-1} e_{i-1} \text{ if } |y_{i-1}| < |y_{i-1}|$$
$$gg_i = s_i e_i \text{ otherwise} \quad (6)$$

Where $gg_i$ is the gain gradient, s is the sign value and e is the sample error measured in terms of the difference between the sample and its closest target. When S=1, $e_i=y_i-1$ and when S=−1, $e_i=y_i+1$.

Near the ideal sampling points of time delay equal to 0 and 100, the correction is very small (near 0) as expected. Far away from those points, the gain gradient is large (in the absolute sense) to allow for rapid correction of the gain if the sampling point is far from the ideal sampling point.

Figure 7:
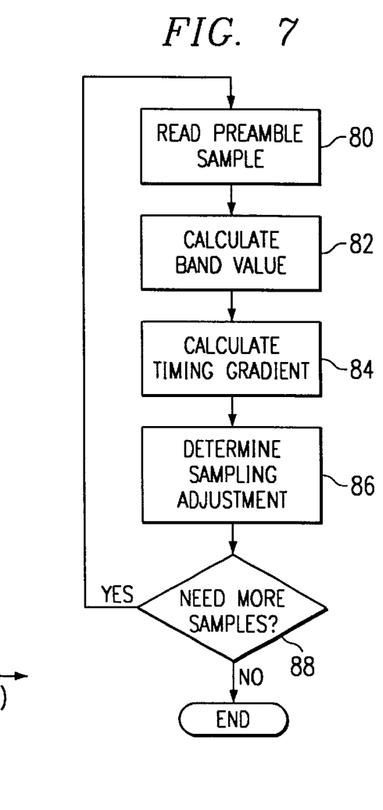
FIG. 7 is a flow chart illustrating the operation of the present invention.

FIG. 7 is a flowchart illustrating the operation of the present invention. In step 90 a first sample of the preamble signal is read by read/write head 21. In the present invention, data is stored in an EPR4 scheme and the ideal sampling values occur at 1, 0, and −1. The initially sampled value in a noiseless system can occur at any value between 1 and −1. In a system with noise the value may exceed 1 and −1. The initial value is based on the clock signal of read head 21.

After the first sample, the read/write head 21 continues to sample preamble signals in step 92. In step 94 the band and error values are calculated for the sampled values. Then the timing gradient is calculated using the equation for EPR4 in step 96. The timing gradient is then used to calculate integral timing and the timing phase in the loop filter 72 and VCO 74 in step 98. In step 100, the new timing phase is used to sample the preamble. The process continues throughout the preamble expectation at some point the ideal sampling instance is sampled.

Although the present invention and its advantages have been described in detail, it should be understood that various changes, substitutions, and alterations can be made therein without departing from the spirit and scope of the present invention as defined by the appended claims.

What is claimed is:

1. A method for acquiring a preamble signal in a hard disk drive using an EPR4 scheme comprising:

reading in a sample value of the preamble;

calculating a timing gradient value using a single term timing gradient equation; and calculating a new timing phase using the timing gradient value, the timing phase representing a timing adjustment.

2. The method of claim 1, wherein the step of calculating a timing gradient value further comprises:

determining a band value, $b_i$, for the sample value and previous sample value, $b_{i-1}$; and calculating the timing gradient using equation $tg_i=-b_{i-1}y_i$ if the sample value is closer to 0 than the previous sample value and $tg_i=b_iy_{i-1}$ otherwise, wherein t is the timing phase, tg is the timing gradient, b is the band value and y is the sample value.

3. The method of claim 1, wherein the step of calculating a timing gradient value further comprises:

calculating the timing gradient using the equation $tg_i=-s_{i-1}y_i$ if the sample value is closer to zero than the previous sample value and $tg_i=s_iy_{i-1}$ otherwise, where s is the sign bit having a value of +1 or −1, wherein t is the timing phase, tg is the timing gradient, s is the sign value and y is the sample value.

4. The method of claim 1, wherein the step of calculating a new timing phase comprises:

calculating an integral timing; and calculating a timing phase using the integral timing and timing gradient.

5. The method of claim 4, wherein the equation for integral timing is $dT_i=dT_{i-1}-\rho tg_i$ and the equation for timing phase is $\tau_i=\alpha tg_i-dT_{i-1}$ where $\rho$ is an integral term loop gain and $\alpha$ is a proportional loop gain, wherein dT is the integral timing, t is the timing phase and tg is the timing gradient.

6. A hard disk drive system comprising:

a storage media system;

a read channel for reading data from the storage media system, the read channel operable to read a preamble;

a phase lock loop coupled to the read channel and operable to acquire the preamble signal the phase lock loop comprising:

a timing gradient generator operable to determine a timing gradient using a single term timing gradient equation;

a loop filter, coupled to the timing gradient, the loop filter operable to determine proportional and integral timing; and a voltage control oscillator coupled to the loop filter and operable to determine a timing phase, the timing phase representing a timing adjustment for the read channel.

7. The system of claim 6, wherein the timing gradient value is determined by determining a band value for the sample value and previous sample value; and calculating the timing gradient using equation $tg_i=-b_{i-1}y_i$ if the sample is closer to zero than the previous sample value and $tg_i=b_iy_{i-1}$ otherwise, wherein t is the timing phase, tg is the timing gradient, b is the band value and y is the sample value.

8. The system of claim 6, wherein the timing gradient value is determined by using the equation $tg_i=-s_{i-1}y_i$ if the sample value is closer to zero than the previous sample value and $tg_i=s_iy_{i-1}$ otherwise, where s is the sign bit having a value of +1 or −1, wherein t is the timing phase, tg is the timing gradient, s is the sign value and y is the sample value.

9. The method of claim 6, wherein calculating the timing phase comprises:

calculating an integral timing; and calculating a timing phase using the integral timing and timing gradient.

10. The method of claim 9, wherein the equation for integral timing is $dT_i=dT_{i-1}-\rho tg_i$ and the equation for timing phase is $\tau_i=\alpha tg_i-dT_{i-1}$ where $\rho$ is an integral term loop gain and $\alpha$ is a proportional loop gain, wherein dT is the integral timing, t is the timing phase and tg is the timing gradient.

11. A circuit for adjusting the timing phase of an input signal comprising:

a timing gradient generator operable to receive the sampled input signal and calculate a timing gradient based on a single term timing gradient equation;

a loop filter coupled to the timing gradient and operable to determine an integral timing; and a voltage controlled oscillator coupled to the loop filter and operable to determine a timing phase correction from the integral timing and the timing gradient.

12. The circuit of claim 11, wherein the timing gradient value is determined by determining a band value for the sample value and previous sample value; and calculating the timing gradient using equation $tg_i=-b_{i-1}y_i$ if the sample is closer to zero than the previous sample value and $tg_i=b_iy_{i-1}$ otherwise, wherein t is the timing phase, tg is the timing gradient, b is the band value and y is the sample value.

13. The circuit of claim 11, wherein the timing gradient value is determined by using the equation $tg_i=-s_{i-1}y_i$ if the sample value is closer to zero than the previous sample value and $tg_i = s_i y_{i-1}$ otherwise, where s is the sign bit having a value of +1 or −1,     wherein t is the timing phase, tg is the timing gradient, s is the sign value and y is the sample value.

14. The circuit of claim 11, wherein calculating the timing phase comprises:

calculating an integral timing; and calculating a timing phase correction using the integral timing and timing gradient.

15. The circuit of claim 11, wherein the equation for integral timing is $dT_i = dT_{i-1} - \rho tg_i$ and the equation for timing phase is $\tau_i = \alpha tg_i - dT_{i-1}$ where $\rho$ is an integral term loop gain and $\alpha$ is a proportional loop gain,     wherein dT is the integral timing, t is the timing phase and tg is the timing gradient.

* * * * *